ELECTRIC ENERGY AMPLIFYING CIRCUIT ARRANGEMETS

Filed Oct. 24, 1965

*INVENTOR*
CARL P. HOLLSTEIN JR.
*By* [signature]
ATTORNEY

United States Patent Office 3,422,336
Patented Jan. 14, 1969

3,422,336

ELECTRIC ENERGY AMPLIFYING CIRCUIT ARRANGEMENTS

Carl Paul Hollstein, Jr., Campbell, Calif., assignor to International Business Machines Corporation, Armonk, N.Y., a corporation of New York Filed Oct. 24, 1965, Ser. No. 504,455
U.S. Cl. 330—9 15 Claims
Int. Cl. H03f 1/02

ABSTRACT OF THE DISCLOSURE

A stable, amplifying circuit with an open loop gain approaching infinite obtains from a conventional feedback amplifier circuit and an auxiliary amplifier circuit or repeater interposed in the circuit for algebraically adding to the input voltage a correction voltage proportional to the difference between the feedback voltage and the input voltage to the amplifier circuit.

Both differential and single-ended amplifier circuits may be used as desired.

Zero drift compensation may also be incorporated.

The invention relates to electric energy amplifying circuit arrangements, and it particularly pertains to precision feedback amplifier and/or feedback control systems.

In precision amplifier and servo system design, it is understood that the effects of both distortion and noise in the amplifier can be greatly reduced at the cost of reduced gain by the use of negative feedback. Normally, the loop gain is much larger than unity so that the closed loop gain can be assumed a function of the feedback factor only. It is thus intended that the gain then be dependent only on the characteristics of the feedback circuits. In reality, the actual output signal differs from the ideal because of non-infinite open loop gain and error signals generated in the open loop amplifier. For a desired increase of accuracy in gain, the magnitude of the amplification factor A necessary according to this assumption is so large that closed loop stability problems appear. Furthermore, the error voltage component present in practice represents all offset voltages in the amplifier whereby some error signal remains regardless of the value of the amplification factor A.

While it is, of course, impossible to build an amplifier with infinite open loop gain, an object of the invention is to arrange the circuit of an amplifier to simulate infinite open loop gain and improve the accuracy without unduly sacrificing stability and response of feedback amplifiers and servo systems.

Another object of the invention is to reduce the complexity and the cost of precision feedback amplifier and servo systems.

According to the invention, the objects are attained in an overall circuit arrangement having an electric energy amplifier by interposing an auxiliary electric energy amplifier, or repeater, and applying the input energy of the electric energy amplifier simultaneously to the repeater for producing output correction energy and adding it to the input signal energy. The repeater is adjusted for substantially unity gain and is designed to match impedances thereby simulating infinite open loop gain for the circuit.

Further, according to the invention, the repeater is arranged for zero drift operation to improve the accuracy of the amplifier without sacrificing stability in a resultant lower cost, relatively simple, circuit arrangement.

Still further, according to the invention, the error correction method is applicable to any feedback control system where it is desired to maintain a small difference between the input signal and the output response.

An electric energy translating circuit arrangement according to the invention basically comprises an amplifier to the input of which electric energy is applied and from the output of which a stabilized output electric energy is delivered, electric energy deriving means coupled to the output of the amplifier for deriving electric energy related to the output energy in a predetermined relationship, as by a conventional amplifier feedback circuit proportioning the output voltage of the amplifier or as by a conventional control feedback element in a servo circuit, and means for applying the related electric energy to the input of the amplifier in opposition to the input energy controlling the system. The difference between the two energies is a difference energy across the input circuit. The heart of the invention is a repeater having input circuitry to which the difference electric energy is applied and output circuitry at which correction electric energy is derived and coupled to the input of the amplifier for adding the correction electric energy to the input electric energy.

In order that the practical aspects of the invention may be more readily attained in practice, several embodiments of the invention, given by way of examples only, are described hereinafter with reference to the accompanying drawing forming a part of the specification and in which.

Figure 1:
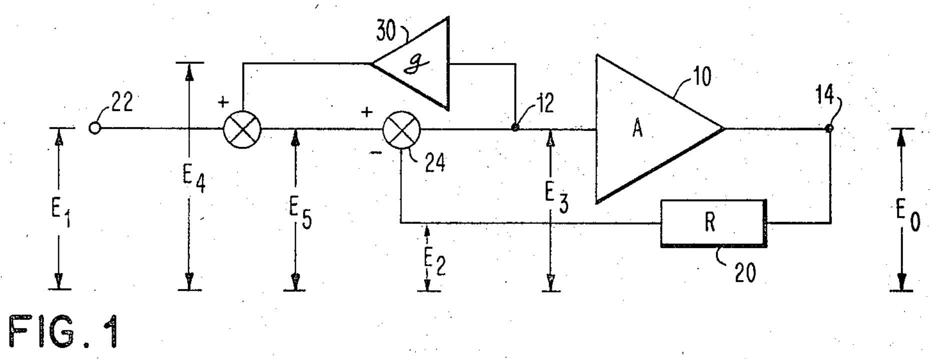
FIG. 1 is a functional diagram of a system according to the invention.
Figure 2:
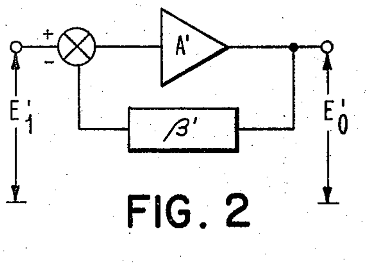
FIG. 2 is a functional diagram of a conventional feedback amplifier.

FIG. 1 functionally shows an arrangement for amplifying electric energy according to the invention as contrasted with a similar functional diagram at FIG. 2 of a conventional feedback amplifying arrangement. The output voltage of the latter is conventionally expressed:

$$E_0' = \frac{E_1'}{\beta' + \frac{1}{A'}} \qquad (1)$$

In such an arrangement, it is conventional to have the loop gain $A'\beta'$ much larger than unity with the amplification factor A' sufficiently large that the resulting reciprocal is negligibly small compared to the feedback ratio $\beta'$. For practical purposes, in the prior art the output voltage is treated as equal to the input voltage divided by the feedback factor.

For an arrangement with $\beta$ equal to 0.01 and a ratio of output to input voltage equal to 100±0.01%, the amplification factor A' must be at least $10^6$. It is readily seen that the design of a stable closed loop amplifier having such a high open loop gain is difficult at best. Some advantage can be obtained in a feedback amplifier of predetermined closed loop gain by adjusting the value of the feedback factor $\beta$ to provide the desired closed loop gain for an amplification factor A', only sufficiently large to hold the variations within the specified limits. The above mentioned ratio by this method will require an amplification factor A′ of only $10^5 \pm 10\%$. This method is not readily applicable to variable gain amplifiers or to operational amplifiers where it is desired to have the feedback components determine the gain.

It is to be clearly understood that the electric energy is manifested either in voltage or in current or both at different points in all of the arrangements shown and described, but for convenience in explanation, the arrangements will be viewed as though energy is manifested solely in voltages referenced to the same point of reference potential, often, but not necessarily, ground potential. Referring again to FIG. 1, an amplifier 10 has an input terminal 12 and an output terminal 14. It is desired that an output voltage $E_0$ be produced at the output terminal 14 in response to amplification of an input voltage $E_1$ applied at a system input terminal 22. Electric voltage deriving means 20 are electrically connected to the output terminal 14 for deriving a related voltage $E_2$ and applying it by way of a mixing point 24 for producing a difference voltage $E_3$ at the amplifier input terminal 12. According to the invention, the difference voltage $E_3$ is also applied to an auxiliary amplifier or repeater 30 for producing a correction voltage $E_4$ which is applied at a mixing point 34 in additive relationship to the input voltage $E_1$ to produce a sum voltage:

$$E_5 = E_1 + E_4 \quad (2)$$

At the amplifier input terminal 12, the effective difference voltage:

$$E_3 = E_2 - E_5 \quad (3)$$

For an amplification factor A for the amplifier 10:

$$E_0 = AE_3 \quad (4)$$

Expressing the relationship of the output voltage to the input voltage of the deriving means 20 as R:

$$E_2 = RE_0 \quad (5)$$

Similarly, for a gain $g$ for the repeater 30:

$$E_4 = gE_3 \quad (6)$$

The output voltage of the overall amplifying arrangement is now:

$$E_0 = \frac{E_1}{R + \frac{1-g}{A}} \quad (7)$$

According to the invention, the gain $g$ of the repeater 30 preferably is made identically equal to unity, reducing the numerator of the reciprocal term to zero. In this manner, the output voltage $E_0$ is truly a function only of the input voltage $E_1$ and the derived voltage relationship factor R, and the effective open loop gain is infinite. In practice, the gain $g$ of the repeater 30 may be adjusted very nearly equal to unity, but may vary within predetermined tolerance limits and the effective open loop gain:

$$A_{eff} = \frac{A}{1-g} \quad (8)$$

If the gain $g$ were equal to $1 \pm 0.01\%$, the minimum value of the effective open loop gain would be $A \cdot 10^4$.

Figure 3:
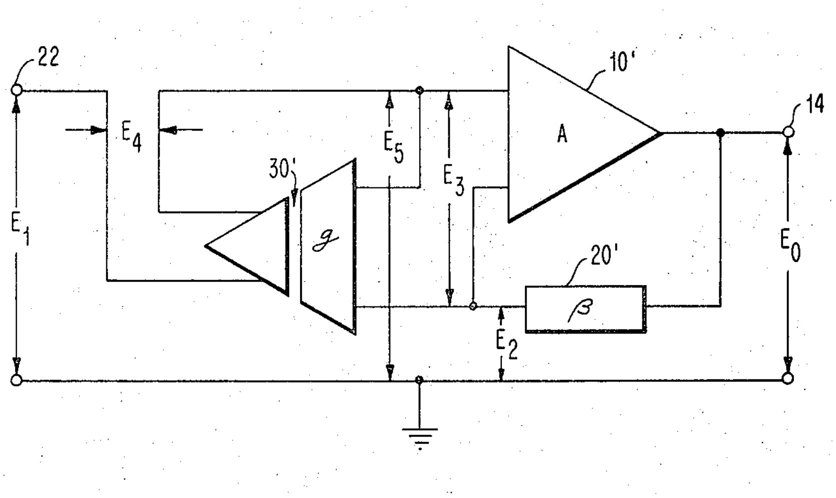
FIG. 3 is another functional diagram of an arrangement of a stabilized amplifier system according to the invention.

FIG. 3 is a functional diagram of a stabilized amplifier system wherein the related voltage $E_2$ derived from the related voltage generating means 25 is a feedback voltage proportional to the output voltage $E_0$ by the factor $\beta$ and the amplifier 10′ is one having a differential input. The signal voltage $E_1$ is applied (by way of suitable series connecting means in the output of the repeater 30′, later shown and described) to one input terminal of the differential amplifier 10′ and the feedback voltage $E_2$ is applied to the other input terminal. The difference voltage $E_3$, which appears across the two input terminals of the amplifier 10′, is also applied to the input terminals of a repeater 30′ having a differential input circuitry isolated from the output circuitry so that the latter may be floating with respect to ground reference potential. As briefly alluded above, the correction voltage $E_4$ is applied in series between the composite input terminal 22 and the input terminal of the differential amplifier 10′. The feedback network 20′ may be in the form of a pair of series resistor voltage divider and auto-transformer or a dual winding transformer or any other known feedback voltage generating or deriving circuitry.

Figure 4:
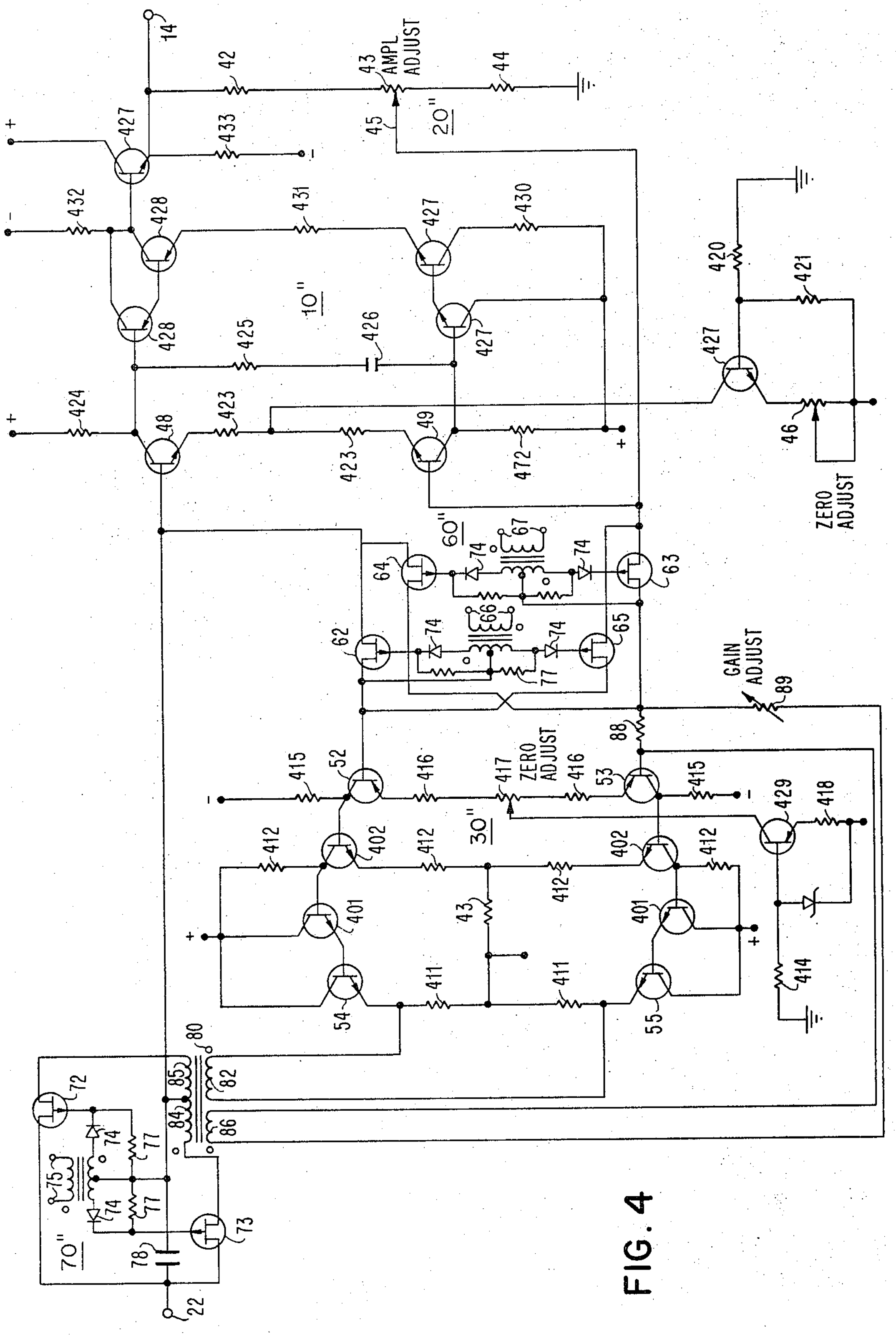
FIG. 4 is a schematic diagram of a stabilized zero drift amplifying arrangement according to the invention.

FIG. 4 is a schematic diagram of a precision amplifier according to the invention. The amplifier 10″ is a differential amplifier with single-ended output. A feedback network, comprising series connected resistor 42, potentiometer 43 and resistor 44, permits adjustment of the amplification factor by varying the position of the arm 45 of the potentiometer 43. Zero adjustment is provided by a potentiometer 46 in the emitter biasing circuit of the input transistors 48 and 49 of the amplifier 10″. The repeater 30″ comprises input transistors 52 and 53 and output transistors 54 and 55. The difference voltage $E_3$ is applied to the input of the input transistors of the repeater 30″ by means of a modulator 60 comprising four switching field effect transistors (FET) 62, 63, 64 and 65 selectively switched in response to a square wave voltage train of at least twice the highest significant signal frequency applied at the terminals 66 and 67 of isolating and driving transformers. Additional details of such a modulator may be had by referring to the copending U.S. patent application Ser. No. 427,246 of Carl Paul Hollstein, Jr., filed on Jan. 22, 1965 and issued on Mar. 26, 1968 as U.S. Patent 3,375,457 for "Data Acquisition Amplifier." A demodulator 70 comprising two field effect transistors 72 and 73 is switched in synchronism with the modulator transistors by applying the same square wave to the terminal 75. In practice, a single transformer with a single primary winding and three secondary windings, each center tapped, is preferably used. The output of the repeater 30″ is developed across a primary winding 82 of a transformer 80 and effectively added in series by means of secondary windings 84 and 85 between the composite input terminal 22 and the base of the input transistor 48 of the amplifier 10″. A smoothing capacitor 78 is coupled between the composite input terminal 22 and the junction of the secondary windings 84 and 85. A tertiary winding 86 on the transformer 80 is arranged to feed back a portion of the output energy to the input transistor 53 by way of a fixed resistor 88 and a variable resistor 89, the latter of which is used to adjust the gain of the repeater 30″ to substantially unity.

Figure 5:
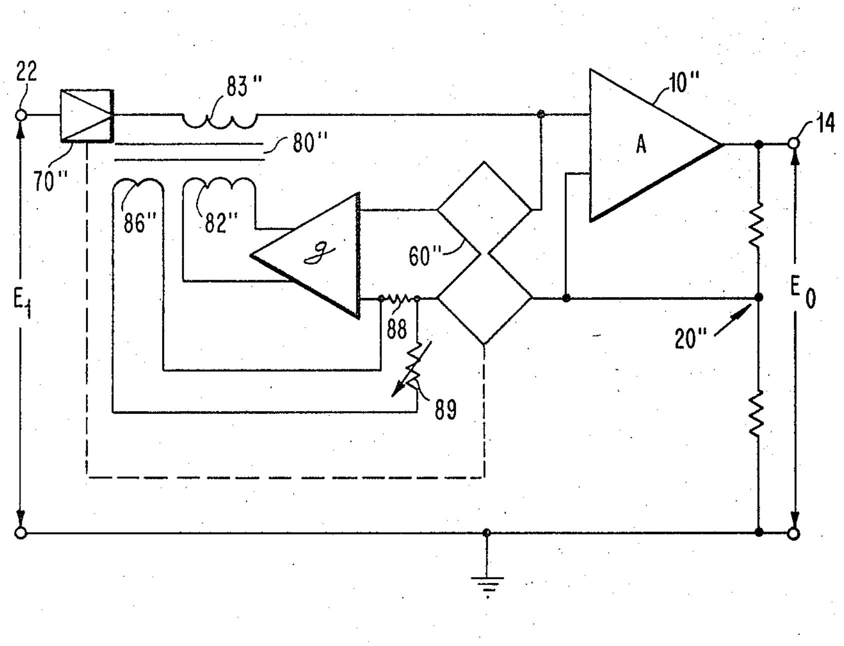
FIG. 5 is a functional diagram explanatory of the amplifier shown in FIG. 4.

The carrier type repeater 30″ of FIG. 4 is more clearly seen from a functional viewpoint in FIG. 5 from which is evident any type of modulator 60″ and demodulator 70″ known to the art may be used. For instance, in addition to the field effect transistor switching arrangement shown in detail in FIG. 4, double emitter transistor switches, electro-optical choppers, relay or vibrator type choppers, balance modulators and demodulators and the like may be used with equal efficiency, modulator/demodulator system not being a part of the invention in and of themselves. In the interest of clarity, a single secondary winding 83″ is shown in FIG. 5, but it should be borne in mind that series addition of the correction voltage $E_4$ is actually accomplished with the output transformer 80″ by the alternate connection of the secondary portion 84 and 85 in opposing polarities. The use of a single transformer 80″ lends itself to effective isolation and impedance matching, the feedback voltage controlling the gain of the repeater being adjusted by varying the resistor 89.

Figures 6, 7:
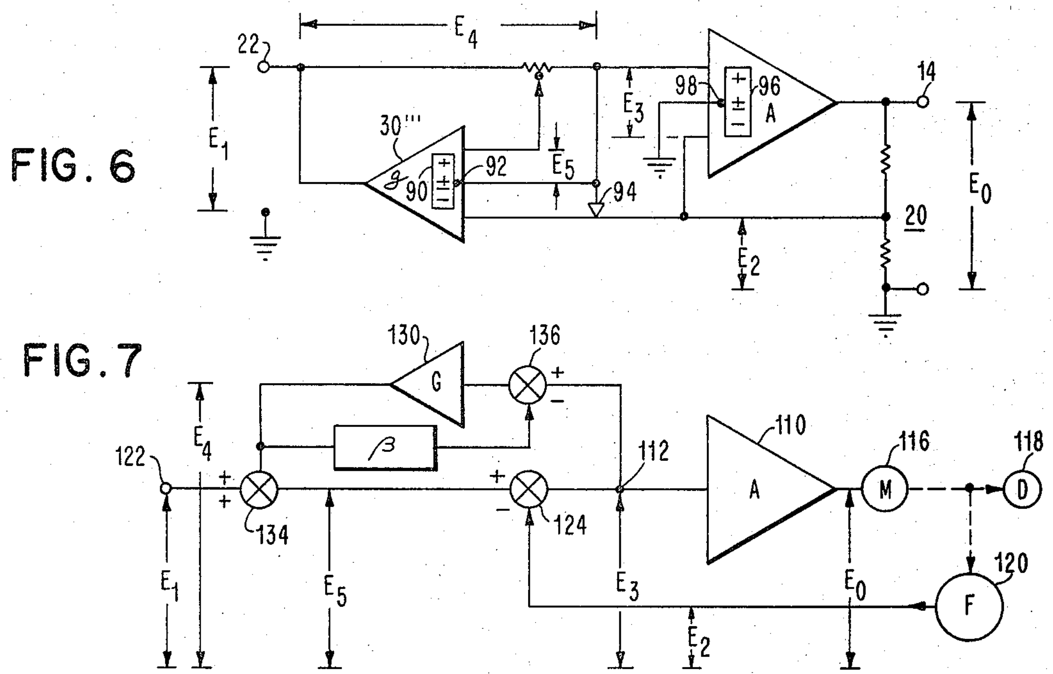
FIG. 6 is another functional diagram of a practical amplifying arrangement according to the invention.
FIG. 7 is a functional diagram of a stabilized servo system according to the invention.

FIG. 6 is a functional diagram of a composite amplifier according to the invention wherein a repeater 30‴ differs in that it has a floating reference point power supply 90 having a neutral terminal 92 connected to a floating reference point 94. The power supply for the amplifier 10‴ has a neutral terminal 98 connected to ground. Circuitry shown in FIG. 4 may be readily used in the configuration shown in FIG. 6. Alternatively, the repeater 30‴ might be a differential input/differential output amplifier as will be described hereinafter in connection with FIG. 8.

The error correction according to the invention is not limited to precision feedback type amplifier, but is applicable to any feedback control system. FIG. 7 is a functional diagram of a typical feedback control system having an amplifier 110 coupled to a motor 116 for driving a desired device 118 in accordance with a voltage $E_1$ applied at composite input terminals 122. A related voltage $E_2$, illustrated here as a voltage developed by a rate generator or tachometer 120 coupled to the driving motor 116, is applied at a mixing point 124 in opposition to a sum voltage $E_5$ resulting from the addition of the input voltage $E_1$ and the correction voltage $E_4$. The repeater 130 may be the same as previously described and with or without feedback compensation applied at a mixing point 136.

Figure 8:
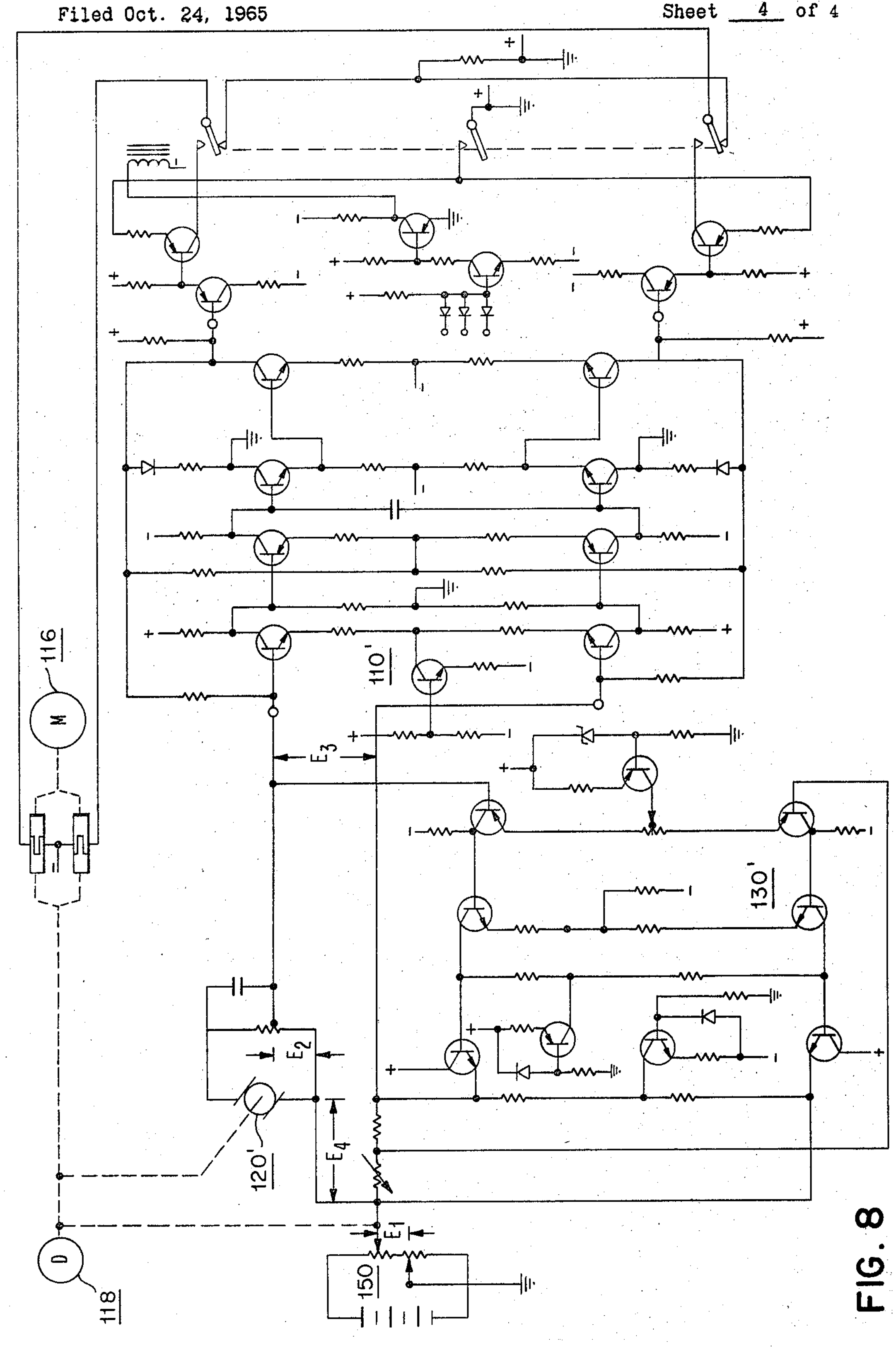
FIG. 8 is a schematic diagram of an example of a servo system to which the invention is applicable.

An example of a servo system applying the principles functionally illustrated in FIG. 7 is shown schematically in FIG. 8. Here, the principles are applied to the more complex positioning servo system of the type shown and described in U.S. Patent 3,183,420 of Carl Eugene Westenskow wherein the voltage from the tachometer 120' is referenced to ground through a position generator 150. The repeater 130' is an example of a differential input/differential output amplifier avoiding the requirement for floating ground. The amplifier 110' is an example of such an amplifier wherein the final stages are designed to manifest the electric energy in terms of current variations rather than voltage variations.

The related or feedback voltage generating device 120 may alternatively be potentiometer circuits similar to the position generator 150 of FIG. 8 except that the arm is driven by the shaft of the motor 116 or a synchro or a simulated rate generator such as the type shown and described in the text Servo Mechanism Practice, by Ahrendt, McGraw Hill Book Co., 1954, pp. 138–141. According to the invention, a feedback servo system is enhanced even when the related voltage $E_2$ is not strictly proportional to the output of the amplifier 110 because the application of the difference voltage $E_3$ to the repeater 130 still tends to eliminate the reciprocal of the amplification factor A of the amplifier 110 by adjusting the gain $g$ of the repeater 130 to substantially unity.

Figure 9:
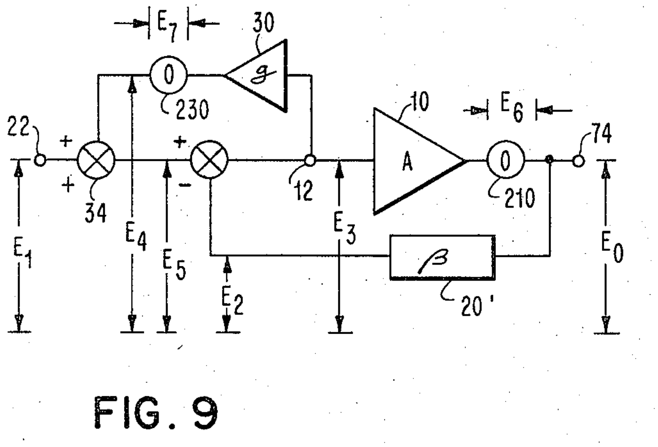
FIG. 9 is a functional diagram of an arrangement according to the invention useful to an understanding of the error correcting ability of the arrangement according to the invention.

There are many sources of error in precision amplifiers in servo systems. FIG. 9 is a functional diagram of a precision amplifier along the lines of that functional diagram of FIG. 1 with an offset and drift voltage generator 210 interposed in the output lead of the amplifier 10, and another offset and drift voltage generator 230 interposed in the output lead of the repeater 30. According to the invention, the amplifier offset and drift voltage $E_6$ may be effectively controlled by controlling the repeater offset and drift voltage $E_7$. This can be shown:

$$E_0=AE_3+E_6 \quad (9)$$

$$E_0=A(E_5-\beta E_0)+E_6 \quad (10)$$

$$E_5=E_1+g(E_5-\beta E_0)+E_7 \quad (11)$$

$$E_5=\frac{E_1+E_7-g\beta E_0}{1-g} \quad (12)$$

$$E_0=A\left(\frac{E_1+E_7-g\beta E_0}{1-g}\right)+E_6 \quad (13)$$

$$E_0=\frac{A}{1-g}(E_1+E_7-\beta E_0)+E_6 \quad (14)$$

from which:

$$E_0=\frac{E_1+E_7}{\beta=\frac{1-g}{A}}+\frac{(1-g)\frac{E_6}{A}}{\beta+\frac{1-g}{A}} \quad (15)$$

Thus, by holding the repeater drift voltage $E_7$ (which acts in effect as an incremental input voltage) to a minimum, the amplifier drift is minimized. Hence, a less expensive, simpler high gain amplifier may be used with a somewhat more critical unity gain repeater to obtain the desired output at less overall expense.

The following component values were used in amplifiers built along the lines schematically set forth in FIG. 4 and similar values are suggested for use with the arrangement of FIG. 8:

| Reference No. | Component | Value or type |
|---|---|---|
| 42–44 | Resistors | 5.1 kilohms. |
| 43 | Potentiometer | 500 ohms. |
| 46 | do | 20 kilohms. |
| 48–49 | Transistor | 2N2639. |
| 52–53 | do | 2N3804. |
| 54–55 | do | 2N1893. |
| 62–65, 72, 73 | FE Transistor | 2N2608. |
| 74 | Diodes | FD 300. |
| 77 | Resistor | 100 k. |
| 78 | Capacitor | 1 microfarad. |
| 80 | Transformer | Low inter-winding capacity. |
| 88 | Resistor | 100 kilohms. |
| 89 | do | 1 kilohm. |
| 401 | Transistor | 2N1893. |
| 402 | do | 2N2639. |
| 411 | Resistor | 6.2 kilohms. |
| 412 | do | 6.8 kilohms. |
| 413 | do | 16 kilohms. |
| 414 | do | 10 kilohms. |
| 415 | do | 200 kilohms. |
| 416 | do | 500 ohms. |
| 417 | Potentiometer | 100 ohms. |
| 418 | Resistor | 36 kilohms. |
| 420 | do | 27 kilohms. |
| 421 | do | 2.7 kilohms. |
| 422 | do | 100 kilohms. |
| 423 | do | 510 kilohms. |
| 424 | do | 130 kilohms. |
| 425 | do | 1.2 kilohms. |
| 426 | Capacitor | 100 picofarads. |
| 427 | Transistor | 2N914. |
| 428 | do | 2N2411. |
| 429 | do | FI 0019. |
| 430 | Resistor | 15 kilohms. |
| 431 | do | 2 kilohms. |
| 432 | do | 56 kilohms. |
| 433 | do | 4.7 kilohms. |

The invention claimed is:

1. An electric energy amplifying circuit arrangement comprising:
   - input terminals to which input electric energy is applied,
   - output terminals at which stabilized output electric energy is delivered,
   - an amplifier for translating electric energy between said terminals and having
     - an input circuit and
     - an output circuit coupled to said output terminals,
     - electric energy deriving means coupled to said output circuit for deriving electric energy related to said output energy in predetermined relationship,
   - a repeater for deriving correction electric energy and having
     - input circuitry, and
     - output circuitry coupled to said input terminals for algebraically summing said input electric energy and said correction electric energy derived from said repeater,
   - means coupled to said input circuit of said amplifier for combining said summed electric energy and said related electric energy in opposition for deriving difference electric energy at said input circuit of said amplifier, and
   - means for applying said difference electric energy to said input circuitry of said repeater.

2. An electric circuit arrangement as defined in claim 1 and wherein said electric energy is manifested in voltage.

3. An electric circuit arrangement as defined in claim 1 and wherein said repeater has substantially unity gain.

4. An electric circuit arrangement as defined in claim 3 and wherein said repeater is also an impedance matching arrangement.

5. An electric circuit arrangement as defined in claim 1 and wherein said electric energy deriving means is feedback deriving circuitry.

6. An electric circuit arrangement as defined in claim 1 and wherein said electric energy deriving means is a servo error signal deriving arrangement.

7. An electric circuit arrangement as defined in claim 1 and wherein said amplifier is a differential amplifier and the input circuit thereof has two terminals, and
said related voltage is applied to one terminal other than that to which said input and correction voltages are applied.

8. An electric circuit arrangement as defined in claim 7 and wherein said repeater is also a differential amplifier with input circuitry having two terminals, and
said terminals are connected to the terminals of said input circuit of said amplifier.

9. An electric circuit arrangement as defined in claim 1 and wherein said repeater is preceded by
a modulator and followed by
a demodulator,
thereby providing drift correction for said amplifier.

10. An electric circuit arrangement as defined in claim 8 and wherein said repeater is energized by a power supply system referenced to the same reference potential as said amplifier.

11. An electric energy amplifying circuit arrangement as defined in claim 9 and wherein said modulator comprises a switching circuit including four transistors connecting the input terminals of said repeater cyclically and alternately to the input terminals of said amplifier.

12. An electric energy amplifying circuit arrangement as defined in claim 9 and wherein said demodulator comprises a switching circuit including two transistors cyclically and alternately effectively connecting the output terminals of said repeater in series between said input terminals and an input terminal of said amplifier in synchronism with the switching of said modulator.

13. An electric energy amplifying circuit arrangement as defined in claim 9 and wherein there is interposed in said demodulator circuit a transformer having
a primary winding connected to the output circuit of said repeater, and
a secondary winding having a center tap connected to said input terminal of said amplifier and terminals individually connected to said demodulating transistors.

14. An electric energy amplifying circuit arrangement as defined in claim 9 and wherein said transformer has a tertiary winding, connected in series in an input lead, to said repeater, and
a variable resistor is connected to said tertiary winding for varying the feedback current in the repeater circuit.

15. An electric energy amplifying circuit arrangement as defined in claim 1 and wherein
the gain of said amplifier is substantially unity, and
the gain of said repeater lies within the limits of ±0.1% of unity,
whereby the open loop gain of the circuit arrangement approaches infinity.

References Cited

UNITED STATES PATENTS

| | | | |
|---|---|---|---|
| 2,968,005 | 1/1961 | Patmore | 330—10 X |
| 3,218,566 | 11/1965 | Hayes | 330—9 |
| 3,222,607 | 12/1965 | Patmore | 330—10 X |
| 3,237,117 | 2/1966 | Collings et al. | 330—9 |

NATHAN KAUFMAN, *Primary Examiner.*

U.S. Cl. X.R.

330—10, 103